(12) United States Patent
Chan et al.

(10) Patent No.: US 8,841,709 B2
(45) Date of Patent: Sep. 23, 2014

(54) JFET DEVICE AND METHOD OF MANUFACTURING THE SAME

(75) Inventors: Wing Chor Chan, Hsinchu (TW); Chih Min Hu, Kaohsiung (TW); Jeng Gong, Taichung (TW)

(73) Assignee: Macronix International Co., Ltd. (TW)

( * ) Notice: Subject to any disclaimer, the term of this patent is extended or adjusted under 35 U.S.C. 154(b) by 352 days.

(21) Appl. No.: 13/450,373

(22) Filed: Apr. 18, 2012

(65) Prior Publication Data

US 2013/0277718 A1    Oct. 24, 2013

(51) Int. Cl.
*H01L 29/66*    (2006.01)

(52) U.S. Cl.
USPC ............................ 257/280; 438/167; 438/169

(58) Field of Classification Search
USPC ................... 257/280; 438/167, 169
See application file for complete search history.

(56) References Cited

U.S. PATENT DOCUMENTS

| | | | | |
|---|---|---|---|---|
| 4,304,042 A | * | 12/1981 | Yeh | 438/174 |
| 5,508,539 A | * | 4/1996 | Gilbert et al. | 257/280 |
| 2005/0184343 A1 | * | 8/2005 | Thornton et al. | 257/351 |
| 2010/0032731 A1 | * | 2/2010 | Babcock et al. | 257/280 |
| 2013/0082322 A1 | * | 4/2013 | Weber et al. | 257/329 |

* cited by examiner

*Primary Examiner* — Errol Fernandes
(74) *Attorney, Agent, or Firm* — Baker & McKenzie LLP (57) ABSTRACT

A disclosed semiconductor device includes a semiconductor deposition layer formed over an insulation structure and above a substrate. The device includes a gate formed over a contact region between first and second implant regions in the semiconductor deposition layer. The first and second implant regions both have a first conductivity type, and the gate has a second conductivity type. The device may further include a second gate formed beneath the semiconductor deposition layer.

20 Claims, 5 Drawing Sheets

JFET DEVICE AND METHOD OF MANUFACTURING THE SAME

BACKGROUND

1. Technical Field

The present application relates to semiconductor technology, and more particularly to Junction Field Effect Transistor (JFET) devices and methods of making JFET devices.

2. Related Art

Figure 1:
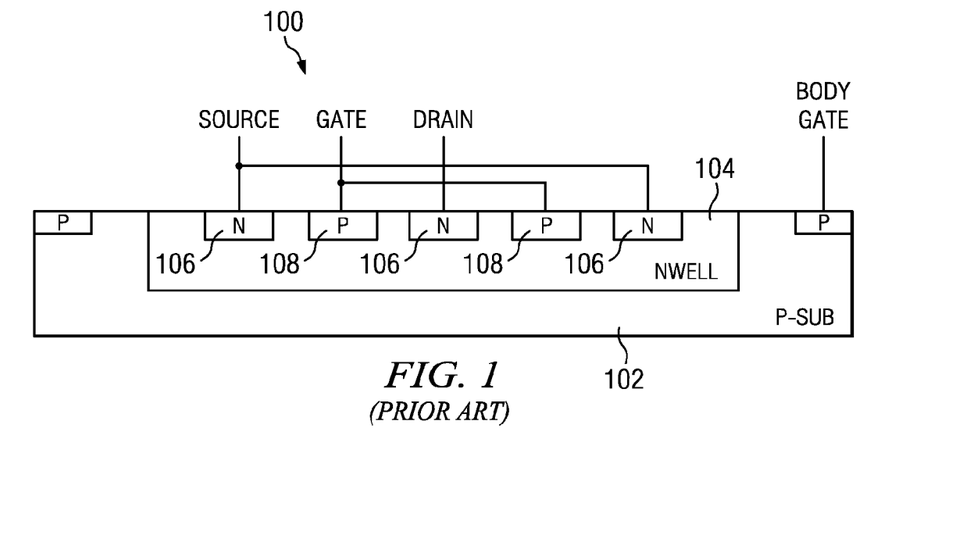
FIG. 1 shows a cross-sectional view of a conventional JFET device.

JFET devices are known to have a configuration as shown in FIG. 1. The JEFT device 100 shown in FIG. 1 is formed on a semiconductor substrate 102, such as a silicon wafer. The substrate 102 may be modified by implantation processes, such as diffusion doping, ion implantation, or in-situ doping, to introduce P-type impurities. An N-well 104 is formed in the substrate 102 to provide a channel for electric charge to flows between a source and a drain terminal. The N-well 104 can be formed by known well implantation processes that introduce N-type impurities. The JFET device 100 also includes first implant regions 106 and second implant regions 108. The first implant regions 106 each include a heavier concentration of N-type impurities and can serve as a source or a drain. The implant regions 108 each include P-type impurities and can serve as a gate.

In operation, a positive drain-source voltage, $V_{DS}$, induces electric charge to flow within the N-well 104 from the sources to the drain. The conductance of the N-well 104 may be controlled by a negative gate-source voltage, $V_{GS}$, which induces a depletion region around each pn junction. The $V_{GS}$ may be varied to a point where the depletion regions pinch off the channel for electric charge flow, thereby turning off the JFET device 100. The voltage to achieve a pinch off may be designated as $V_p$. When a JFET device 100 is integrated into an integrated circuit, the effect of noise from the semiconductor substrate can cause $V_p$ to vary, which results in irregularities and defects in the JFET devices. As such, isolated JFET devices are desired to allow for more precise $V_p$.

SUMMARY

A first exemplary embodiment disclosed herein is directed to a semiconductor device comprising a substrate, an insulation structure formed over the substrate and a semiconductor deposition layer formed over the insulation structure and above the substrate, the semiconductor deposition layer having a first conductivity type. The disclosed semiconductor device further includes a first implant region formed in the semiconductor deposition layer, the first implant region having the first conductivity type and having a heavier doping concentration than the semiconductor deposition layer, and a second implant region formed in the semiconductor deposition layer, the second implant region having the first conductivity type and having a heavier doping concentration than the semiconductor deposition layer. The disclosed semiconductor device also includes a metal contact layer formed on a contact region of the semiconductor deposition layer between the first and second implant regions, whereby a junction forms between the metal layer and the contact region of the semiconductor deposition layer, wherein the junction is a Schottky barrier.

A second exemplary embodiment disclosed herein is directed to a semiconductor device comprising a substrate, a first insulation structure formed over the substrate, and a first semiconductor deposition layer formed over the first insulation structure. The disclosed semiconductor device further includes a second insulation structure formed over the first semiconductor deposition layer and a second semiconductor deposition layer formed over the second insulation structure, the second semiconductor deposition layer having a conductivity type. The disclosed semiconductor device may include a first implant region formed in the second semiconductor deposition layer, the first implant region having the conductivity type and having a heavier doping concentration than the second semiconductor deposition layer, and a second implant region formed in the second semiconductor deposition layer, the second implant region having the conductivity type and having a heavier doping concentration than the second semiconductor deposition layer. A metal contact layer may be formed on a contact region of the second semiconductor deposition layer between the first and second implant regions, whereby a junction forms between the metal contact layer and the contact region of the second semiconductor deposition layer, wherein the junction is a Schottky barrier.

Related methods of manufacturing the semiconductor devices of the present disclosure are also disclosed.

BRIEF DESCRIPTION OF THE DRAWINGS

Features, aspects, and embodiments of the inventions are described in conjunction with the attached drawings, in which.

DETAILED DESCRIPTION

Figure 2:
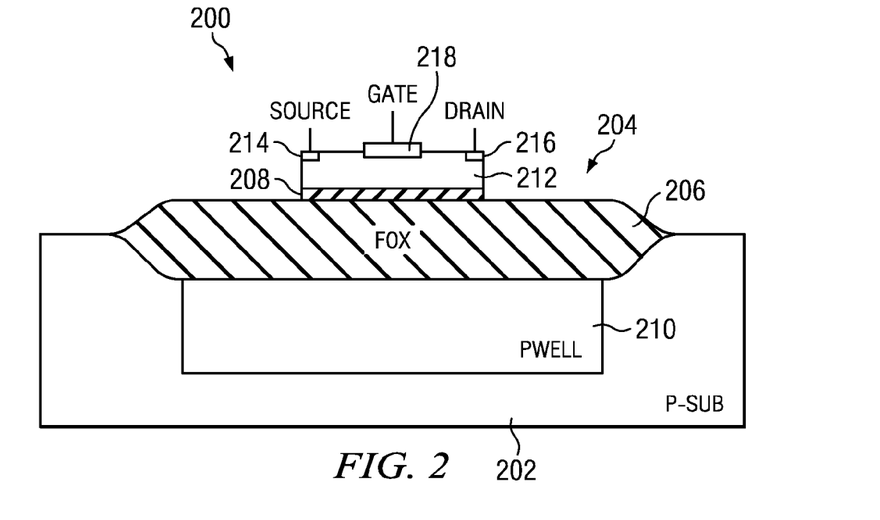
FIG. 2 shows a cross-sectional view of a JFET device according to the present disclosure.

FIG. 2 shows a cross-sectional view of a JEFT device 200 that allows for reduced noise and improved pinch off sharpness. The JFET device 200 includes a substrate 202 and an insulation structure 204 formed over the substrate 202. The insulation structure 204 is operable to substantially shield the structures above from the effects of noise and interferences from the substrate 202 below. The insulation structure 204 may include a field oxide (FOX) layer 206 formed over the substrate 202, and in some embodiments, may further include a high temperature oxide (HTO) layer 208 disposed on the FOX layer 206. The FOX layer 206 and the HTO layer 208 can be formed using standard, known masking and thermal oxidation techniques. For example, a local oxidation of silicon (LOCOS) process can be used to form the FOX layer 206. The same process may be repeated to form the HTO layer 208. Exemplary LOCOS techniques include shallow trench isolation (STI) or silicon on insulator (SOI). While variations are possible, the FOX layer 206 can have a thickness that is in a range of 1,000 to 10,000 angstroms, preferably about 5,000 angstroms, and the HTO layer 208 can have a thickness that is in a range of 120 to 400 angstroms, preferably about 300 angstroms.

Below the insulation structure 204, a first well region 210 may be formed in the substrate 202 beneath the insulation structure 204. In the embodiment illustrated in FIG. 2, the substrate 202 includes P-type impurities, but in another embodiment, the substrate 202 may include N-type impurities. In either embodiment, the first well region 210 may be a P-well as illustrated or an N-well.

Above the insulation structure 204, a semiconductor deposition layer 212 may be formed over the insulation structure 204 by a deposition process. The semiconductor deposition layer 212 may have a first conductivity type to allow electric charge to flow from a source 214 to a drain 216. The conductance in the semiconductor deposition layer 212 may be controlled by a gate 218. The structure of the JFET device 200 will now be described in greater detail in view of FIG. 3.

Figure 3:
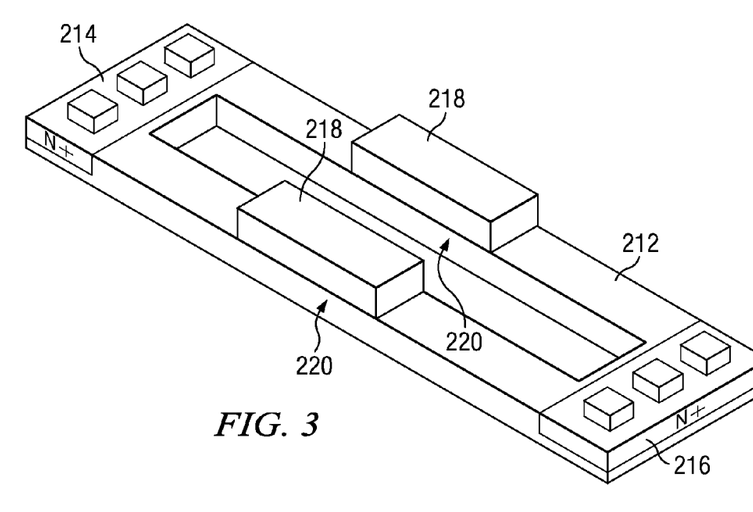
FIG. 3 shows a partial, elevational view of certain structures in the JFET device shown in FIG. 2.

FIG. 3 is a partial, elevational view of the JFET device 200. The semiconductor deposition layer 212 may be a layer of polysilicon fabricated by standard processing, and as discussed above, the semiconductor deposition layer 212 may be modified by implantation processes to have a first conductivity type, which may be N-type or P-type. In an exemplary embodiment, the semiconductor deposition layer 212 may be formed by depositing polysilicon and N-type impurities such as, lightly doped phosphoryl chloride ($POCl_3$), which may be introduced by in-situ doping during the deposition of the polysilicon. In an embodiment, the concentration of POCl3 may be about $1*10^{11}/cm^2$. Other examples of N-type impurities may be used, such as phosphorous (P). In another embodiment, N-type impurities may be introduced by diffusion doping of ion implantation, or in-situ doping. In yet another embodiment, P-type impurities, if desired, may be introduced into the semiconductor deposition layer 212 using the same processes. An example of P-type impurities is boron (B).

A first implant region 214 may be formed in the semiconductor deposition layer 212 such that the first implant region 214 has the first conductivity type and a heavier doping concentration than the semiconductor deposition layer 212. The first implant region 214 may be designated as the source 214. A second implant region 216 may be formed in the semiconductor deposition layer 212 such that the second implant region 216 has the first conductivity type and a heavier doping concentration than the semiconductor deposition layer 212. The second implant region 216 may be designated as the drain 216.

In the exemplary embodiment illustrated in FIG. 3, the first conductivity is N-type, and the semiconductor deposition layer 212 is operable to provide an N-channel for electric charge to flow between the first and second N+ implant regions 214, 216. It is to be appreciated that, in another embodiment, the first conductivity may be P-type, and the semiconductor deposition layer 212 is operable to provide a P-channel for electric charge to flow between the first and second P+ implant regions 214, 216.

In addition to the semiconductor deposition layer 212, the JFET device 200 may further include a metal contact layer 218 formed on a contact region 220 of the semiconductor deposition layer 212 between the first and second implant regions 214, 216. The metal contact layer 218 may include a suitable metal to allow a junction between the metal contact layer 218 and the contact region 220 of the semiconductor deposition layer 212 to be considered a Schottky barrier. Depending on whether the semiconductor deposition layer 212 includes N-type or P-type impurities, the Schottky barrier may act as a P-type gate or an N-type gate, respectively. As such the metal contact layer 218 may be designated as gate 218. To form a P-type gate, the metal contact layer 218 may include suitable metals such as Ti, W, Ni, Pt, Al, Au, and Co. To form an N-type gate, the metal contact layer 218 may include suitable metals such as platinum (Pt).

The gate 218 is operable to control the conductance of a channel in the semiconductor deposition layer 212. In operation, the positive drain-source voltage, $V_{DS}$, induces electric charge to flow within the semiconductor deposition layer 212 from the source 214 to the drain 216. The conductance of the semiconductor deposition layer 212 may be controlled by the negative gate-source voltage, $V_{GS}$, which induces a depletion region within or proximate to the contact region 220. The $V_{GS}$ may be varied to a point where the depletion regions pinch off the channel for electric charge flow, thereby turning off the JFET device 200. The pinch off voltage may vary depending on the thickness of the semiconductor deposition layer 212. In an exemplary embodiment, the thickness of the layer 212 may be in a range that allows for a pinch off voltage between 0.7 to 30 volts. In an embodiment, the semiconductor deposition layer 212 can have a thickness that is in a range of 500 to 6,000 angstroms.

It is to be appreciated that by forming metal contact layer 218 and the semiconductor deposition layer 212 above the insulation structure 204 and the substrate 202, the noise and interference from the substrate 202 are substantially reduced, which, in turn, allows for improved control over the conductance of the semiconductor deposition layer 212 by the gate 218 and more precise pinch off voltage. Another advantage of the disclosed structure is that the first well region 210 below the insulation structure 204 may be utilized to accommodate additional devices that would otherwise not been possible had the space is used to create the pn junction in a JFET.

Figure 4:
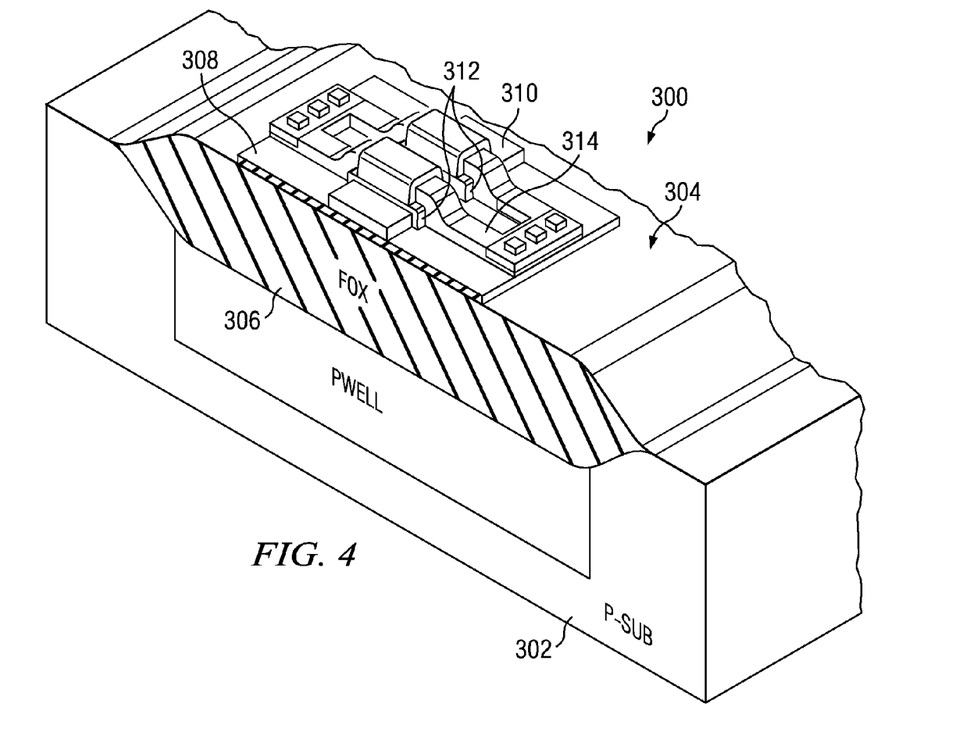
FIG. 4 shows an elevational view of a JFET device with a three-dimensional gate structure according to the present disclosure.

FIG. 4 is an elevational view of a JFET device 300 with a three-dimensional gate structure. The JFET device 300 includes a substrate 302 and a first insulation structure 304 formed over the substrate 302. Similar to the insulation structure 204 discussed with respect to FIGS. 2 and 3, the first insulation structure 304 is operable to substantially shield the structures above from the effects of noise and interferences from the substrate 302 below. The first insulation structure 304 may include a field oxide (FOX) layer 306 formed over the substrate 302. In some embodiments, the first insulation structure 304 may further include a gate oxide layer 308 disposed on the FOX layer 306. The FOX layer 306 and the gate oxide layer 308 can be formed using standard, known masking and thermal oxidation techniques.

Figure 5:
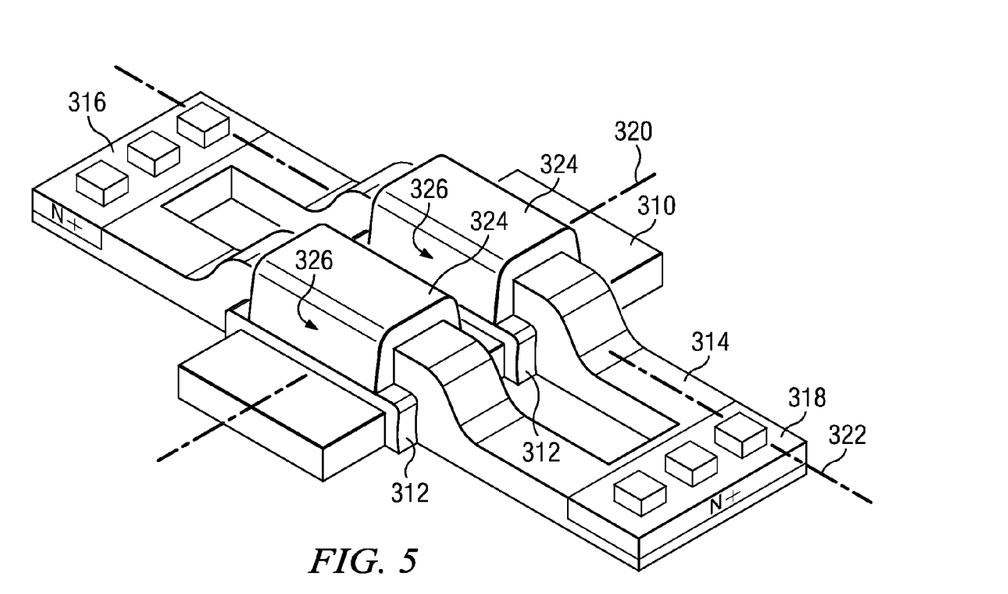
FIG. 5 shows a partial, elevational view of a first embodiment of certain structures in the JFET device shown in FIG. 4.

The JFET device 300 further includes a first semiconductor deposition layer 310 formed over the first insulation structure 306, a second insulation structure 312 formed over the first semiconductor deposition layer 310, and a second semiconductor deposition layer 314 formed over the second insulation structure 312. FIG. 5 is a focused view of the structures in the JFET device 300 form above the first insulation structure 306. In an embodiment, the first and second semiconductor deposition layers 310, 314 may extend along first and second longitudinal axes 320, 322, respectively, as shown in FIG. 5. In an exemplary embodiment, the first longitudinal axis 320 is substantially orthogonal to the second longitudinal axis 322, but in other embodiments, the first and second axes 320, 322 may be aligned at an angle. The first semiconductor deposition layer 310 may include either N-type or P-type impurities to provide the electrical properties desired in forming a three-dimensional gate, which will be described in greater details below. In an embodiment, the first semiconductor deposition layer 310 may be deposited with WSi or CoSi to form slicide that reduces the resistance in the first semiconductor deposition layer 310. The insulation structure 312 may be a layer of HTO similar to the HTO layer 208 in the embodiments shown in FIGS. 2 and 3.

Furthermore, the second semiconductor deposition layer 314 may be substantially similar to the semiconductor deposition layer 212 in the embodiments shown in FIGS. 2 and 3. The second semiconductor deposition layer 314 may be a layer of polysilicon fabricated by standard processing and may be modified by implantation processes to have a first conductivity type, which may be N-type or P-type. In the exemplary embodiment shown in FIG. 6, the second semiconductor deposition layer 314 may be formed by depositing polysilicon on the first and second insulation structures 306 and 312, and N-type impurities may be implanted in the second semiconductor deposition layer 314 by in-situ doping during the deposition of the polysilicon. In another embodiment, N-type impurities may be introduced by diffusion doping of ion implantation, or in-situ doping. In another embodiment, P-type impurities instead of N-type impurities, if desired, may be introduced into the second semiconductor deposition layer 314 using the same processes.

Figure 6:
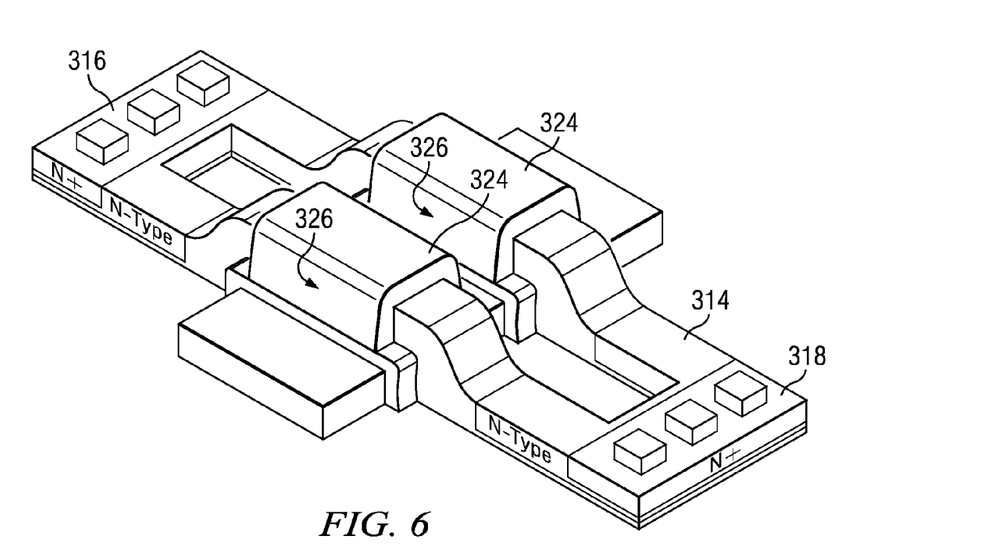
FIG. 6 shows a partial, elevational view of a second embodiment of certain structures in the JFET device shown in FIG. 4.

Referring to FIGS. 4-6, a first implant region 316 may be formed in the second semiconductor deposition layer 314 such that the first implant region 316 has the same conductivity type as the second semiconductor deposition layer 314 and a heavier doping concentration than the semiconductor deposition layer 314. The first implant region 316 may be designated as the source 316. A second implant region 318 may be formed in the second semiconductor deposition layer 314 such that the second implant region 318 has the same conductivity type as the second semiconductor deposition layer 314 and a heavier doping concentration than the semiconductor deposition layer 314. The second implant region 318 may be designated as the drain 318.

The JFET device 300 includes a metal contact layer 324 formed on a contact region 326 of the second semiconductor deposition layer 314 between the first and second implant regions 316, 318. Like the metal contact layer 218, the metal contact layer 324 may include a suitable metal to allow a junction between the metal contact layer 324 and the contact region 326 of the second semiconductor deposition layer 314 to be considered a Schottky barrier. And the metal contact layer 324 may surround second semiconductor deposition layer 314 without contacting the first semiconductor deposition layer 310. Depending on whether the second semiconductor deposition layer 314 includes N-type or P-type impurities, the Schottky barrier may act as a P-type gate or an N-type gate, respectively. As such the metal contact layer 324 may be designated as gate 324.

Implanted with either N-type or P-type impurities, the conductivity of second semiconductor deposition layer 314 allows electric charge to flow from the source 316 to the drain 318. The conductance in the second semiconductor deposition layer 314 may be in controlled by both the gate 314 and the first semiconductor deposition layer 310. Acting alone, the gate 324 may control the conductance of the second semiconductor deposition layer 314 with a first negative gate-source voltage, $V_{GS1}$, which induces a depletion region within or proximate to the contact region 326. The $V_{GS1}$ may be varied to a point where the depletion regions pinch off the channel for electric charge flow, thereby turning off the JFET device 300. However, the first semiconductor deposition layer 310 and the second insulating structure 312 may act as a second gate that is operable to form a second depletion region in the second semiconductor deposition layer 314. The second depletion region may be formed by another applying a second negative gate-source voltage $V_{GS2}$ at the electrode (not shown) in contact with the first semiconductor deposition layer 310. The first and second depletion regions may interact with each other to allow for not only greater degrees of control of the pinch off voltage but also further improvement in pinch off precision in addition to the improvement provided by the first insulation structure 306.

Figure 7:
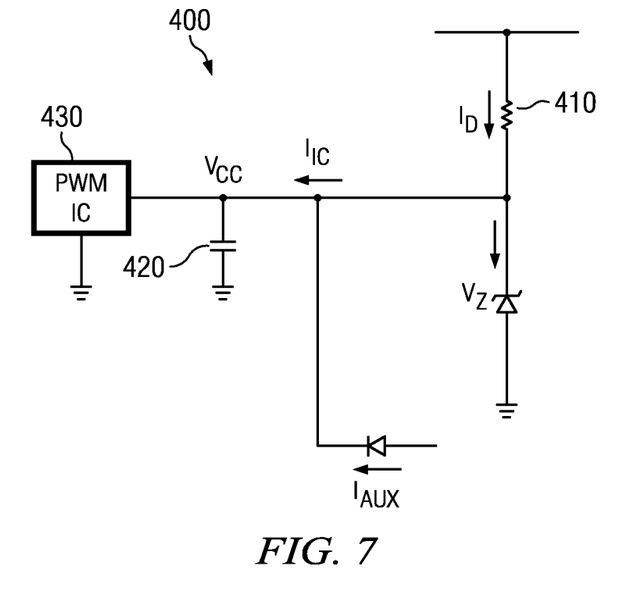
FIG. 7 shows a conventional circuit including a power resistor.

It is to be appreciated that due to the improvement in the control and precision of the pinch-off voltage in the JFET devices of the present disclosure, a variety of improvement in integrated circuit (IC) may be realized. For example, in recent years, the JFET devices of the present disclosure are particularly suitable to allow for higher conversion efficiency and lower standby power consumption in the development of green technology. A switch-mode power IC includes a integrate start-up circuit and a Pulse Width Modulation (PWM) circuit. FIG. 7 shows a conventional high voltage start-up circuit 400 that uses an approach in which power is continuously being dissipated by a power resistor 410 after start-up. The power resistor 410 may be selected such that it will provide the charging current ($I_{IC}$) for the capacitor 420 and the PWM circuit start-up operation. PWM circuit 430 continues to operate until its voltage ($V_{cc}$) falls below the minimum operating voltage rating, and then an auxiliary voltage ($I_{aux}$) is applied to the PWM circuit. The PWM circuit 430 normally operates between 10V~30V. To reduce power consumption, the power resistor 410 of the start-up circuit may be replaced with High Voltage Depletion MOS or High Voltage JFET devices. However, a high voltage depletion NMOS (HVDN) has large leakage current (>100 uA) at threshold voltage (<-4V). A High Voltage JFET (HV JFET) needs large drift region area to form a reduced surface field (RESURF), and as such, the pinch off characteristics of the HV JFET lack precision.

Figure 8:
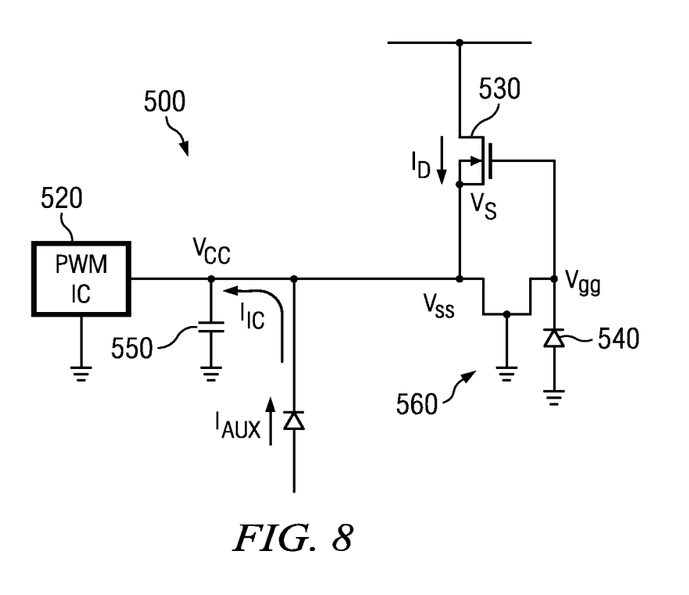
FIG. 8 shows an embodiment of a circuit incorporating a JFET device of the present disclosure.
Figure 9:
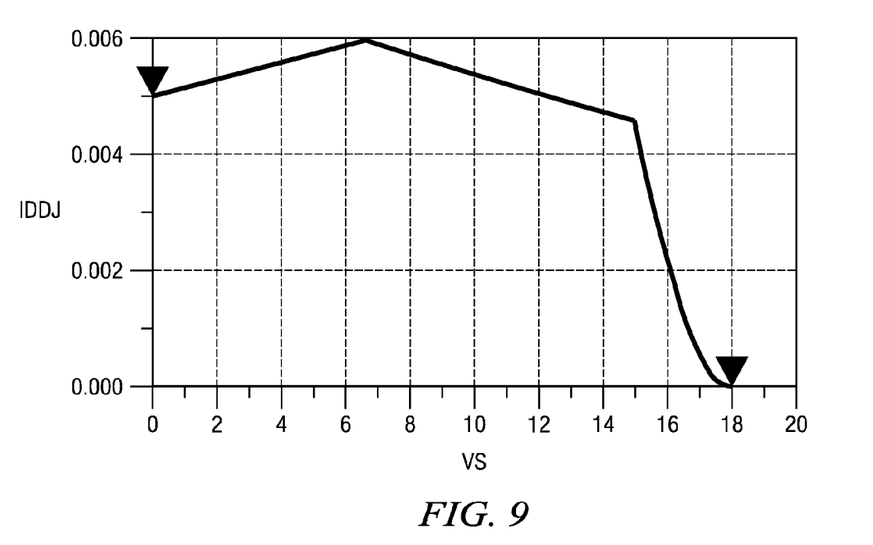
FIG. 9 shows the relationship of source-to-gate voltage of a JEFT device and the drain current from a MOS device in an embodiment of the circuit of FIG. 8.

FIG. 8 illustrates an exemplary circuit 500 incorporating a JFET device 510 according to the present disclosure. The JFET device 510 may any JFET device configured according to the principles of the present disclosure. In addition to the JFET device 510, the circuit 500 further includes a pulse width modulation (PWM) element 520, high voltage depletion metal oxide semiconductor (HV depletion MOS) 530, and a diode 540. In operation, during start up, the source to gate voltage ($V_s$) is less than the pinch off voltage ($V_p$) of the JFET device 510, and the JFET device 510 presents a low resistance. An exemplary $V_p$ is about 15V. When JFET device 510 presents a low resistance, the HV depletion MOS 530, which may have an exemplary threshold voltage ($V_{th}$) of about -3V, is operable to provide the current required at the PWM element 520 and charge up the capacitor 450 until $V_s$ at the JFET device 510 reaches the pinch off voltage. At above $V_p$, $V_s$ at the JFET device 510 would greatly increase the resistance of the JFET device 510 while the drain to source voltage remains the same as $V_p$. When $V_s$ becomes lager than $V_p$ by the threshold voltage, the MOS 530 would be switched off. For example, in an exemplary embodiment, $V_p$ may be about 15V and $V_{th}$ may be about -3V. The graph in FIG. 9 shows that, in such an embodiment, as $V_s$ increased above $V_p$ at about 15V, the current ($I_D$) from the MOS 530 begins to decrease due to the increasing resistance of JFET device 510. When $V_s$ reaches 18V, which is greater than $V_p$ by $V_{th}$, then $I_D$ from the MOS 530 would be switched off. Referring back to FIG. 8, After the PWM start up, the Iaux would be provided to charge up capacitor 550. It is to be appreciated that the precise pinch voltage realized by the JFET device 51 reduces leakage current in the HV depletion MOS 530 and increases efficiency.

While various embodiments in accordance with the disclosed principles have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A semiconductor device comprising:
   a substrate;
   a field oxide structure formed over the substrate;
   a semiconductor deposition layer formed over the field oxide structure and above the substrate, the semiconductor deposition layer having a first conductivity type;
   a first implant region formed in the semiconductor deposition layer, the first implant region having the first conductivity type and having a heavier doping concentration than the semiconductor deposition layer;
   a second implant region formed in the semiconductor deposition layer, the second implant region having the first conductivity type and having a heavier doping concentration than the semiconductor deposition layer; and
   a metal contact layer formed on a contact region of the semiconductor deposition layer between the first and second implant regions, whereby a junction forms between the metal layer and the contact region of the semiconductor deposition layer, wherein the junction is a Schottky barrier.

2. The semiconductor device of claim 1, further comprising a high temperature oxide layer disposed on the field oxide structure.

3. The semiconductor device of claim 1, further comprising a first well region formed in the substrate, wherein the well region is located beneath the insulation structure and has the first conductivity type or a second conductivity type.

4. The semiconductor device of claim 1, wherein the semiconductor deposition layer comprises a polysilicon layer.

5. The semiconductor device of claim 1, wherein the first conductivity is N-type, and the Schottky barrier is operable to function as a P-type gate.

6. The semiconductor device of claim 1, wherein the first conductivity type is P-type, and the Schottky barrier is operable to function as an N-type gate.

7. A semiconductor device comprising:
   a substrate;
   a field oxide structure formed over the substrate;
   a first semiconductor deposition layer formed over the field oxide structure;
   an insulation structure formed over the first semiconductor deposition layer;
   a second semiconductor deposition layer formed over the insulation structure, the second semiconductor deposition layer having a conductivity type;
   a first implant region formed in the second semiconductor deposition layer, the first implant region having the conductivity type and having a heavier doping concentration than the second semiconductor deposition layer;
   a second implant region formed in the second semiconductor deposition layer, the second implant region having the conductivity type and having a heavier doping concentration than the second semiconductor deposition layer; and
   a metal contact layer formed on a contact region of the second semiconductor deposition layer between the first and second implant regions, whereby a junction forms between the metal contact layer and the contact region of the second semiconductor deposition layer, wherein the junction is a Schottky barrier.

8. The semiconductor device of claim 7, further comprising a gate oxide layer disposed on the field oxide structure.

9. The semiconductor device of claim 7, wherein first semiconductor deposition layer comprises a polysilicon layer.

10. The semiconductor device of claim 7, wherein the second insulation structure comprises a high temperature oxide layer.

11. The semiconductor device of claim 7, wherein the second semiconductor deposition layer comprises a polysilicon layer.

12. The semiconductor device of claim 7, wherein the conductivity is N-type, and the Schottky barrier is operable to function as a P-type gate.

13. The semiconductor device of claim 7, wherein the conductivity type is P-type, and the Schottky barrier is operable to function as an N-type gate.

14. The semiconductor device of claim 7, wherein the first and second semiconductor deposition layers extend along first and second longitudinal axes, respectively, and the first longitudinal axis is substantially orthogonal to the second longitudinal axis.

15. A method of manufacturing a semiconductor device comprising:
   forming a field oxide structure formed over a substrate;
   forming a semiconductor deposition layer over the field oxide structure and above the substrate, the semiconductor deposition layer having a first conductivity type;
   forming a first implant region in the semiconductor deposition layer, the first implant region having the first conductivity type and having a heavier doping concentration than the semiconductor deposition layer;
   forming a second implant region in the semiconductor deposition layer, the second implant region having the first conductivity type and having a heavier doping concentration than the semiconductor deposition layer;
   forming a metal contact layer on a contact region of the semiconductor deposition layer between the first and second implant regions, whereby a junction forms between the metal contact layer and the contact region of the semiconductor deposition layer, wherein the junction is a Schottky barrier.

16. The method of claim 15, further comprising forming a high temperature oxide layer over the field oxide structure.

17. The method of claim 15, further comprising a first well region in the substrate, wherein the well region is located beneath the field oxide structure and has the first conductivity type or a second conductivity type.

18. A method of manufacturing a semiconductor device comprising:
- forming a field oxide structure over the substrate;
- forming a first semiconductor deposition layer over the field oxide structure;
- forming an insulation structure over the first semiconductor deposition layer;
- forming a second semiconductor deposition layer over the insulation structure, the second semiconductor deposition layer having a conductivity type;
- forming a first implant region in the second semiconductor deposition layer, the first implant region having the conductivity type and having a heavier doping concentration than the second semiconductor deposition layer;
- forming a second implant region in the second semiconductor deposition layer, the second implant region having the conductivity type and having a heavier doping concentration than the second semiconductor deposition layer; and
- forming a metal contact layer on a contact region of the second semiconductor deposition layer between the first and second implant regions, whereby a junction forms between the metal contact layer and the contact region of the second semiconductor deposition layer, wherein the junction is a Schottky barrier.

19. The method of claim 18, wherein further comprising forming a gate oxide layer over the field oxide structure.

20. The method of claim 18, wherein the first and second semiconductor deposition layers extend along first and second longitudinal axes, respectively, and the first longitudinal axis is substantially orthogonal to the second longitudinal axis.

* * * * *